US006872611B2

(12) United States Patent
Takemori et al.

(10) Patent No.: US 6,872,611 B2
(45) Date of Patent: Mar. 29, 2005

(54) METHOD OF MANUFACTURING TRANSISTOR

(75) Inventors: Toshiyuki Takemori, Hanno (JP); Yuji Watanabe, Hanno (JP)

(73) Assignee: Shindengen Electric Manufacturing Co., Ltd., Tokyo (JP)

(*) Notice: Subject to any disclaimer, the term of this patent is extended or adjusted under 35 U.S.C. 154(b) by 0 days.

(21) Appl. No.: 10/785,960

(22) Filed: Feb. 26, 2004

(65) Prior Publication Data

US 2004/0166619 A1 Aug. 26, 2004

Related U.S. Application Data

(62) Division of application No. 09/660,439, filed on Sep. 12, 2000, now Pat. No. 6,737,704.

(30) Foreign Application Priority Data

Sep. 13, 1999 (JP) ............................................. 11-258687

(51) Int. Cl.[7] ............................................. H01L 21/336
(52) U.S. Cl. ....................................... 438/197; 257/328
(58) Field of Search ......................................... 438/197

(56) References Cited

U.S. PATENT DOCUMENTS

| 4,754,310 | A | | 6/1988 | Coe ............................ 357/13 |
|---|---|---|---|---|
| 4,767,722 | A | * | 8/1988 | Blanchard .................... 438/270 |
| 5,689,121 | A | | 11/1997 | Kitagawa ..................... 257/139 |
| 5,801,408 | A | | 9/1998 | Takahashi .................... 257/212 |
| 5,814,858 | A | | 9/1998 | Williams ..................... 257/328 |
| 5,998,833 | A | | 12/1999 | Baliga ......................... 257/329 |
| 6,114,727 | A | | 9/2000 | Ogura ......................... 257/342 |
| 6,191,447 | B1 | | 2/2001 | Baliga ......................... 257/330 |
| 6,285,060 | B1 | | 9/2001 | Korec .......................... 257/342 |
| 6,297,519 | B1 | | 10/2001 | Fujikawa ..................... 257/59 |
| 6,351,009 | B1 | * | 2/2002 | Kocon et al. ................ 257/328 |
| 6,351,018 | B1 | | 2/2002 | Sapp .......................... 257/499 |
| 6,359,308 | B1 | | 3/2002 | Hijzen ......................... 257/341 |
| 2002/0027227 | A1 | | 3/2002 | Kang ........................... 257/66 |
| 2002/0027237 | A1 | | 3/2002 | Onishi ......................... 257/262 |
| 2002/0036319 | A1 | | 3/2002 | Baliga ......................... 257/328 |

FOREIGN PATENT DOCUMENTS

| DE | 198 44 997 A1 | 4/2000 |
|---|---|---|
| GB | 2 347 014 A | 8/2000 |
| JP | 61-15280 | 7/1986 |
| JP | 8-23092 | 1/1996 |
| JP | 8-162636 | 6/1996 |
| WO | WO 97/33309 | 9/1997 |

OTHER PUBLICATIONS

Daisuke Ueda et al., "An Ultra–Low On–Resistance Power MOSFET Fabricated by Using a Fully Self–Aligned Process" IEEE Transaction on Electron Devices, vol. ED–34, No. 4, Apr. 1987, pp926–930.

D. Kinzer et al., "Ultra–Low Rdson 12 v. P–channel trench MOSFET", The 11th International Symposium in Power Semiconductor Devices and ICS, May 26–28, 1999, pp303–306.

European Search Report (Completed Sep. 27, 2001).

* cited by examiner

*Primary Examiner*—David Nelms
*Assistant Examiner*—Thao P. Le
(74) *Attorney, Agent, or Firm*—Armstrong, Kratz, Quintos, Hanson & Brooks, LLP

(57) ABSTRACT

A technique is provided which makes it possible to reduce the area of a power MOSFET. A power MOSFET 1 according to the invention is a trench type in which a source region 27 is exposed on both of a substrate top surface 51 and an inner circumferential surface 52 of a trench 18. Since this makes it possible to provide contact between the source region 27 and a source electrode film 29 not only on the substrate top surface 51 but also on the inner circumferential surface 52 of the trench 18, source contact is provided with a sufficiently low resistance only on the substrate top surface, and the area of the device can be made smaller than that in the related art in which the source region 27 has been formed in a larger area.

3 Claims, 17 Drawing Sheets

METHOD OF MANUFACTURING TRANSISTOR

This application is a Divisional application of prior application Ser. No. 09/660,439 filed on Sep. 12, 2000 now U.S. Pat. No. 6,737,704.

BACKGROUND OF THE INVENTION

1. Field of the Invention

The present invention relates to transistors and, more particularly, to power MOSFETs which are used in most power supply circuits and the like.

2. Description of the Related Art

Reference number 101 in FIGS. 43 and 44 represents a trench type power MOSFET according to the related art. FIG. 44 is a sectional view taken along the line C—C in FIG. 43.

As shown in FIG. 44, the power MOSFET 101 has a semiconductor substrate 105 provided by forming a drain layer 112 constituted by an $n^-$-type epitaxial layer and p-type body regions 115 on an $n^+$-type silicon substrate 111 sequentially. The power MOSFET 101 also has a plurality of cells 103 as shown in FIG. 43. The plurality of rectangular cells 103 is formed in a staggered configuration on a top surface of the semiconductor substrate 105. FIG. 43 shows six cells $103_1$ through $103_6$ and omits a source electrode film which will be described later.

As shown in FIG. 44, a trench 118 having a rectangular section whose bottom extends into the drain layer 112 is formed in the p-type body region 115 of each cell 103, and a $p^+$-type diffusion region 124 extending to a predetermined depth from the top surface of the p-type body region 115 is formed in a position between adjacent trenches 118. An $n^+$-type source region 127 extending to a depth short of the drain layer 112 from the surface of the p-type body region 115 is formed around the $p^+$-type diffusion region 124 and around the opening of the trench.

A gate insulating film 119 is formed on the inner circumferential surface and the bottom surface of the trench 118, and a polysilicon gate 130 is formed on the surface of the gate insulating film 119 such that it fills the interior of the trench 118 and such that the upper end thereof is located higher than the lower end of the source region 127.

A PSG (phosphosilicate glass) film 128 is formed on top of the polysilicon gate 130, and a source electrode film 129 made of Al is formed to coat the top surfaces of the PSG film 128 and the semiconductor substrate 105. The polysilicon gate 130 and source electrode film 129 are electrically insulated by the PSG film 128.

In a power MOSFET 101 having such a structure, when a voltage equal to or higher than a threshold voltage is applied across the polysilicon gates 130 and the source electrode film 129 with a high voltage applied across the source electrode film 129 and drain layer 112, inversion layers are formed at interfaces between the gate oxide films 119 and p-type body regions, and a current flows from the drain to the source through the inversion layers.

In a power MOSFET 101 having the above-described structure, the PSG films 128 must be patterned using photolithography to provide direct contact between the source electrode film 129 and each of the source regions 127 on the top surfaces of the source regions 127. Since misalignment of the PSG films 128 can occur when they are formed using such a method, the area occupied by the PSG films 128 on the top surface of the semiconductor substrate 105 includes some margin to ensure insulation between the source electrode film 129 and polysilicon gates 130 even if there is some misalignment.

Consequently, the PSG films 128 are formed not only above the trench 118 but also around the openings of the trench.

The parts of the source regions 127 formed around the openings of the trench 118 are therefore located under the PSG films 128 and, in order to provide contact between the source electrode film 129 and the source regions 127 with a sufficiently low resistance, a large area of the source regions 127 must be exposed in advance on the top surface of the semiconductor substrate. As a result, the area occupied by the source regions 127 on the top surface of the semiconductor substrate 105 can not be reduced beyond a certain limit, and this has hindered efforts toward finer devices.

SUMMARY OF THE INVENTION

The present invention has been conceived to solve the above-described problems with the related art, and it is an object of the invention to provide a technique which makes it possible to reduce the area occupied by cells to be formed on a substrate, thereby allowing a reduction of the size of devices.

In order to solve the above-described problems, according to a first aspect of the invention, there is provided a transistor having:

a semiconductor substrate having a semiconductor layer, a drain layer of a first conductivity type provided on the semiconductor layer and an oppositely conductive region of a second conductivity type provided on the drain layer;

a trench provided such that it extends from a top surface of the oppositely conductive region to the drain layer;

a source region of the first conductivity type provided in the oppositely conductive region and exposed on an inner circumferential surface of the trench;

a gate insulating film provided on the inner circumferential surface and inner bottom surface of the trench such that it reaches to the drain layer, the oppositely conductive region and the source region;

a gate electrode material provided in tight contact with the gate insulating film;

a source electrode film provided in contact with at least the source region exposed on the inner circumferential surface of the trench and electrically insulated from the gate electrode material.

According to a second aspect of the invention, there is provided a transistor having a drain electrode film formed on a surface of the semiconductor layer opposite to the drain layer.

According to a third aspect of the invention, there is provided a transistor in which the impurity concentration of the semiconductor layer is higher than the impurity concentration of the drain layer.

According to a fourth aspect of the invention, there is provided a transistor having an insulating material thicker than the gate insulating film provided between the gate electrode material in the trench and the source electrode film.

According to a fifth aspect of the invention, there is provided a transistor in which the insulating material is any one of a silicon oxide film, a combination of a silicon oxide film and PSG film, a combination of silicon oxide film and a BPSG film, and a combination of a silicon oxide film and a silicon nitride film.

According to a sixth aspect of the invention, there is provided a transistor in which the insulating material has a thickness between 0.01 µm and 1.0 µm inclusive.

According to a seventh aspect of the invention, there is provided a transistor in which the trench is provided in the form of a mesh on a top surface of the semiconductor substrate and in which the source region is provided in contact with the trench.

According to an eighth aspect of the invention, there is provided a transistor in which the semiconductor layer is of the first conductivity type.

According to a ninth aspect of the invention, there is provided a transistor in which the semiconductor layer is of the second conductivity type as opposed to the drain layer.

According to a tenth aspect of the invention, there is provided a transistor having:

a semiconductor substrate having a drain layer of a first conductivity type and an oppositely conductive region of a second conductivity type provided on said drain layer;

a trench provided such that it extends from a surface of said oppositely conductive region to said drain layer;

a source region of the first conductivity type provided in said oppositely conductive region and exposed on an inner circumferential surface of said trench;

a gate insulating film provided on the inner circumferential surface and inner bottom surface of said trench such that it reaches to said drain layer, said oppositely conductive region and said source region;

a gate electrode material provided in tight contact with said gate insulating film;

a source electrode film provided in contact with at least said source region exposed on the inner circumferential surface of said trench and electrically insulated from said gate electrode material; and a metal film formed on a surface of said drain layer opposite to said oppositely conductive region to establish Schottky contact with said drain layer.

According to an eleventh aspect of the invention, there is provided a method of manufacturing a transistor, having the steps of:

diffusing an impurity on a top surface of a drain layer of a first conductivity type provided on a semiconductor substrate to form an oppositely conductive region of a second conductivity type;

etching a top surface of the oppositely conductive region to form a trench whose inner bottom surface is located lower than an upper end of the drain layer;

forming a gate insulating film at least on an inner circumferential surface of the trench;

forming a gate electrode material whose upper end is higher than a lower end of the oppositely conductive region in the trench;

forming a source region which is in contact with the gate insulating film and whose lower end is lower than the upper end of the gate electrode material in the oppositely conductive region;

forming an insulating material whose upper end is lower than the opening of the trench on the gate electrode material; and forming a source electrode film in contact with the source region with at least a top surface of the source region exposed.

According to a twelfth aspect of the invention, there is provided a method of manufacturing a transistor in which the top surface of the source region and an inner circumferential surface of the trench in the vicinity of the opening thereof are exposed when the source electrode film is formed.

According to a thirteenth aspect of the invention, there is provided a method of manufacturing a transistor in which the step of forming the insulating material includes the steps of:

forming a first insulating film on a top surface of the gate electrode material, an inner circumferential surface of the trench in the vicinity of the opening thereof and a top surface of the oppositely conductive region;

forming a second insulating film on a top surface of the first insulating film to fill the interior of the trench; and etching the first and second insulating films to leave the first and second insulating films such that upper ends thereof are lower than the opening of the trench.

According to a fourteenth aspect of the invention, there is provided a method of manufacturing a transistor in which the step of forming the gate electrode material includes the step of depositing polysilicon in the trench and in which the step of forming the first insulating film includes the step of oxidizing a top surface of the gate electrode film, the inner circumferential surface of the trench in the vicinity of the opening thereof and the top surface of the oppositely conductive region to form the first insulating film.

A transistor according to the related art has a structure in which a source region is exposed on a top surface of a semiconductor substrate and is in direct contact with a source electrode at the exposed surface. It has been therefore necessary to allow the source region to occupy a somewhat large area on the top surface of the substrate to provide a large contact area between the source electrode and source region in order to maintain a predetermined conduction resistance.

On the contrary, in a transistor according to the invention, since a source electrode film is in direct contact with a source region at least in a part of the source region exposed on an inner circumferential surface of a trench, the contact area between the source region and source electrode film can be made substantially as large as that in the related art by exposing a large area of the source region on the inner circumferential surface of the trench even if the area occupied by the source region on the top surface of the semiconductor substrate is smaller than that in the related art.

This makes it possible to provide source contact between the source region and source electrode film with a sufficiently low resistance as in the related art and to reduce the size of the device by reducing the area occupied by the source region on the top surface of the semiconductor substrate compared to that in the related art.

DETAILED DESCRIPTION OF THE PREFERRED EMBODIMENT

A preferred embodiment of the present invention will now be described with reference to the drawings.

Figure 1:
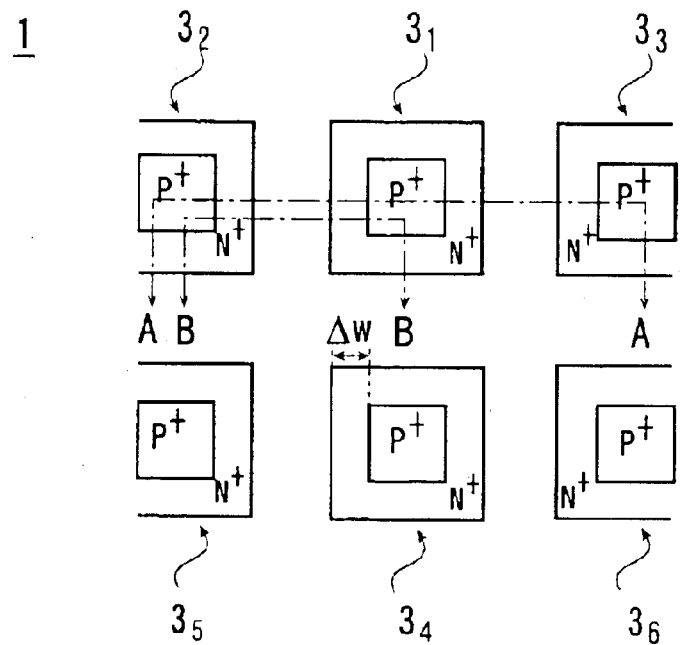
FIG. 1 is a plan view illustrating a configuration of cells of a power MOSFET according to an embodiment of the invention.
Figure 2:
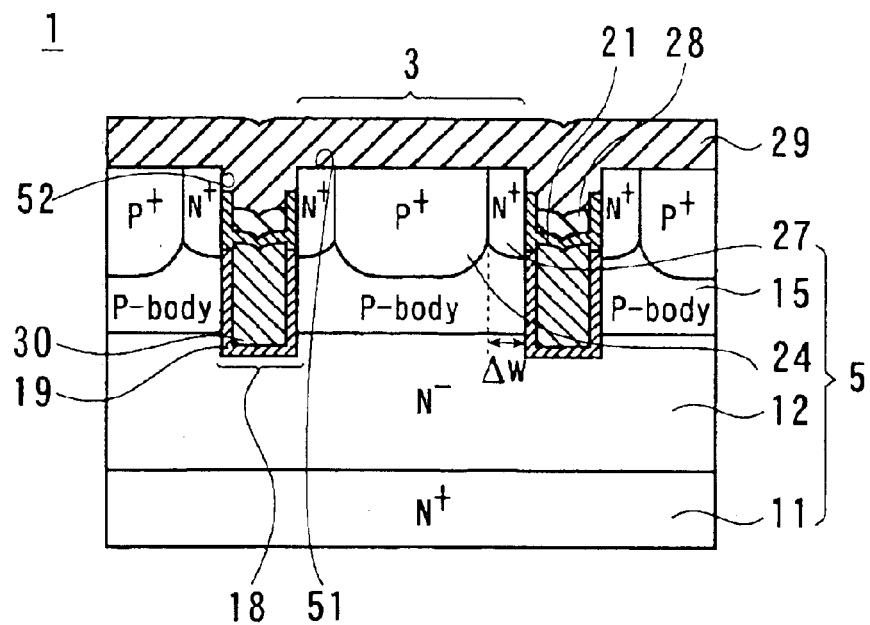
FIG. 2 is a sectional view illustrating the power MOSFET according to the embodiment of the invention.

Reference number 1 in FIGS. 1 and 2 represents a trench type power MOSFET according to an embodiment of the invention. FIG. 2 is a sectional view taken along the line A—A in FIG. 1.

As shown in FIG. 2, the power MOSFET 1 has a semiconductor substrate 5 provided by forming a drain layer 12 constituted by an $n^-$-type epitaxial layer and p-type body regions 15 on an $n^+$-type silicon substrate 11 sequentially. As shown in FIG. 1, a plurality of cells 3 are formed in the form of a grid on a top surface of the semiconductor substrate 5. FIG. 1 shows six cells $3_1$ through $3_6$ and omits a source electrode film which will be described later.

As shown in FIG. 2, a trench 18 whose bottom extends into the drain layer 12 is formed in the p-type body region 15 of each cell 3, and a $p^+$-type diffusion region 24 extending to a depth short of the drain layer 12 from the top surface of the p-type body region 15 is formed in a position between adjacent trenches 18. An $n^+$-type source region 27 extending to a depth short of the drain layer 12 from the top surface of the p-type body region 15 is formed around the $p^+$-type diffusion region 24 and around the trench 18.

The trench 18 is filled with polysilicon gates 30, and the upper ends of the polysilicon gates 30 are located above the lower end of the source regions 27. Gate insulating films 19 are formed between the polysilicon gates 30 and the inner circumferential surface and bottom surface of the trench 18.

In a power MOSFET 1 having such a structure, when a voltage equal to or higher than a threshold voltage is applied across the polysilicon gates 30 and source regions 27 with a high voltage applied across the source electrode film 29 and drain layer 12, inversion layers are formed at interfaces between the gate insulating films 19 and p-type body regions 15, and a current flows from the drain to the source through the inversion layers.

In the present embodiment, the n-type corresponds to the first conductivity type, and the p-type corresponds to the second conductivity type. The p-type body region 15 and $p^+$-type diffusion region 24 forms an example of the oppositely conductive region according to the present invention.

A description will now be made with reference to FIGS. 3 through 23 on steps for forming individual cells $3_1$ through $3_6$ on a silicon substrate 11. FIG. 23 is a sectional view taken along the line B—B in FIG. 1.

Figure 3:
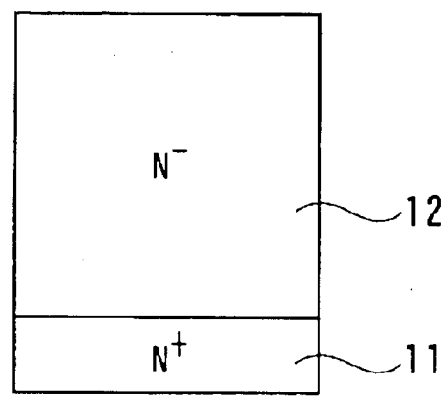
FIG. 3 is a sectional view illustrating a step of forming a cell according to the invention.

First, a drain layer 12 constituted by an n⁻-type epitaxial layer having a thickness in the range from 4 to 5 μm and resistivity of 0.3 Ω·cm is formed on a top surface of an n⁺-type silicon substrate 11 having resistivity of 3×10⁻³ Ω·cm (FIG. 3).

Figure 4:
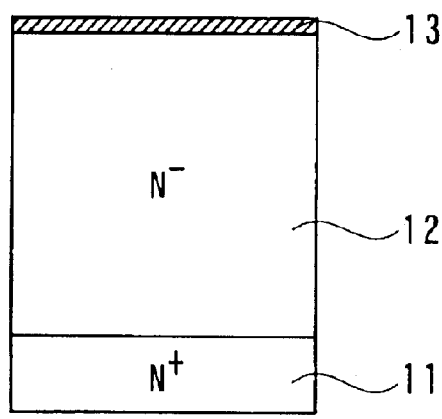
FIG. 4 is a sectional view illustrating a step following the step in FIG. 3.
Figure 5:
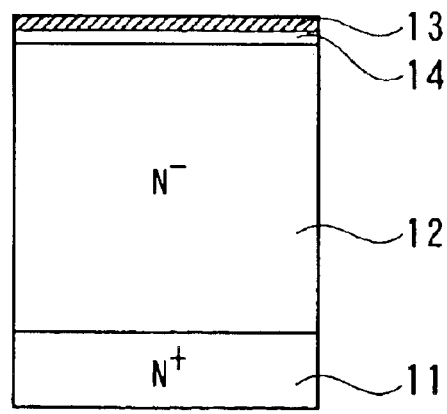
FIG. 5 is a sectional view illustrating a step following the step in FIG. 4.

Next, a thermal oxidation process is performed to form a $SiO_2$ film 13 on the entire surface of the drain layer 12 (FIG. 4). When boron ions (B⁺) are implanted in the drain layer 12 through the $SiO_2$ film 13, a p⁺-type implantation layer 14 is formed in the drain layer 12 in the vicinity of a top surface thereof (FIG. 5).

Figure 6:
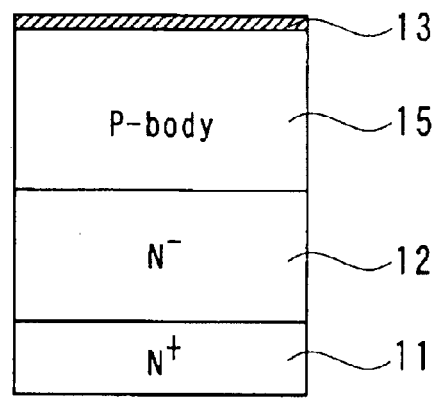
FIG. 6 is a sectional view illustrating a step following the step in FIG. 5.
Figure 7:
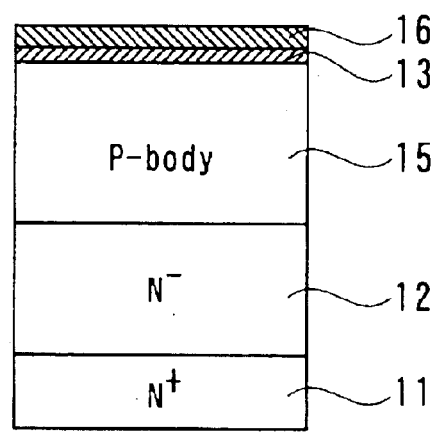
FIG. 7 is a sectional view illustrating a step following the step in FIG. 6.

Next, a thermal process is performed to diffuse the p⁺-type implantation layer 14 in the drain layer 12, thereby forming a p-type body region 15 extending to a depth of 2 μm from the top surface of the drain layer 12 (FIG. 6).

Figure 8:
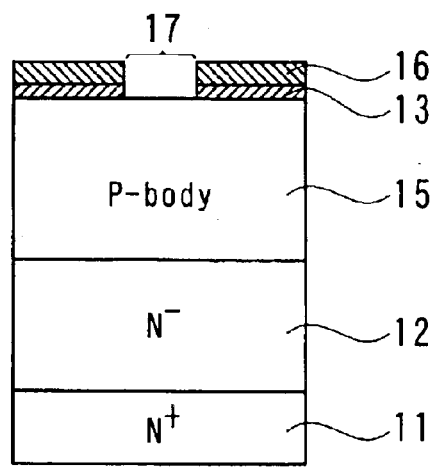
FIG. 8 is a sectional view illustrating a step following the step in FIG. 7.

Next, the CVD method is performed to form a thick $SiO_2$ film 16 on the $SiO_2$ film 13 (FIG. 7), a patterned resist film (not shown) is formed on a top surface of the $SiO_2$ film 16, and the $SiO_2$ films 16 and 13 are thereafter etched and removed using the resist film as a mask. Then, an opening 17 is formed through the $SiO_2$ films 16 and 13, and a part of the top surface of the p-type body region 15 is exposed on the bottom of the opening 17 (FIG. 8).

Figure 9:
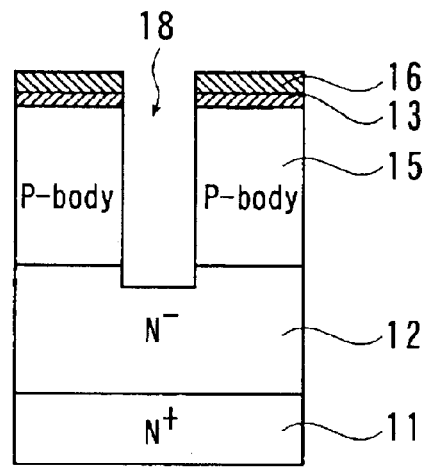
FIG. 9 is a sectional view illustrating a step following the step in FIG. 8.
Figure 10:
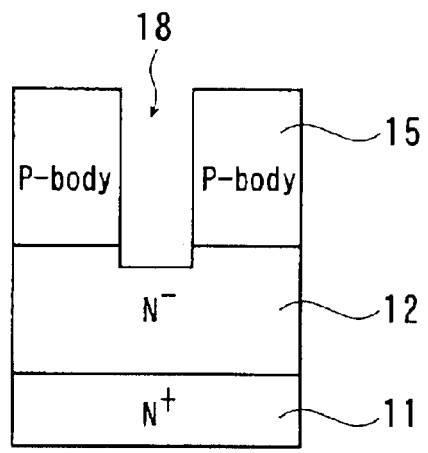
FIG. 10 is a sectional view illustrating a step following the step in FIG. 9.

Next, the resist film is removed, and anisotropic etching such as reactive ion etching is carried out using the $SiO_2$ films 16 and 13 formed with the opening 17 as a mask. As a result, the p-type body region 15 is etched, and a trench 18 having a width of about 0.6 μm and a rectangular section and extending through the p-type body region 15 to reach the drain layer 12 is formed in the p-type body region 15 in the location where the opening 17 has been formed (FIG. 9). The depth of the trench 18 is greater than the thickness of the p-type body region 15, and the bottom surface thereof is located below the upper end of the drain layer 12.

Figure 11:
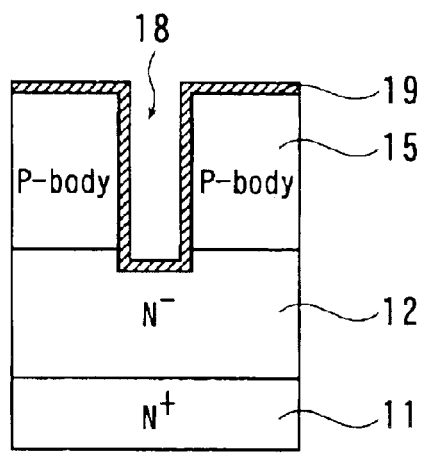
FIG. 11 is a sectional view illustrating a step following the step in FIG. 10.

Silicon is exposed in the trench 18 in this state, and a thermal oxidation process is performed after removing the $SiO_2$ films 16 and 13 (FIG. 10) to expose the top surface of the p-type body region 15 to form a gate insulating film 19 constituted by a silicon oxide film on the entire surface thereof (FIG. 11). In this invention, the gate insulating film 19 is formed with a thickness of 50 nm.

Figure 12:
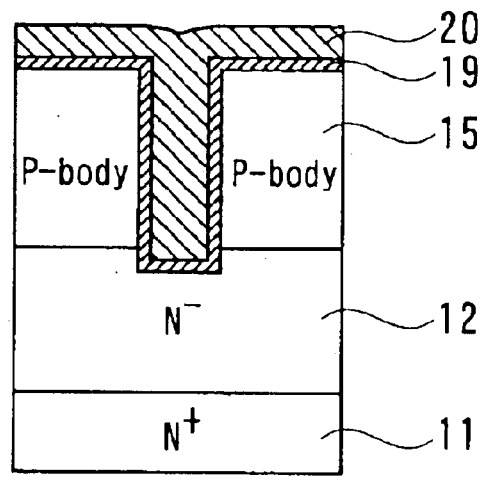
FIG. 12 is a sectional view illustrating a step following the step in FIG. 11.

Next, the CVD method is performed to form a polysilicon thin film doped with phosphorous on the gate insulating film 19, and the interior of the trench 18 is then filled with a polysilicon thin film 20 thus formed (FIG. 12).

Figure 13:
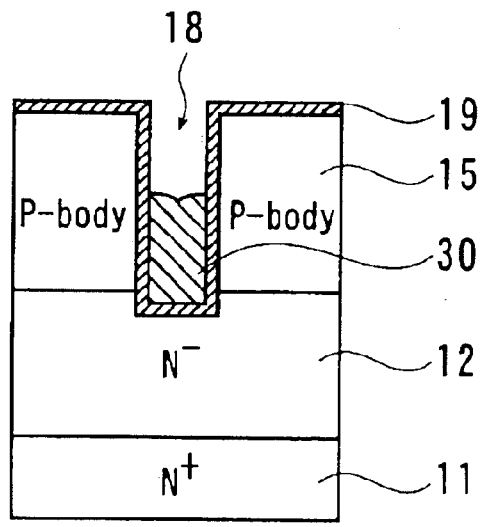
FIG. 13 is a sectional view illustrating a step following the step in FIG. 12.

Next, the polysilicon thin film 20 is etched for a predetermined period of time to remove the polysilicon thin film 20 on the semiconductor substrate with the polysilicon thin film 20 left in the trench 18. At this time, etching is not terminated when the polysilicon thin film 20 on the top surface of the semiconductor substrate is completely removed in order to etch also the top surface of the polysilicon thin film 20 left in the trench 18. Hereinafter, the polysilicon layer left in the trench 18 is referred to as "polysilicon gate" and indicated by reference number 30 (FIG. 13). The polysilicon gate 30 is formed in contact with the gate insulating film 19, and the lower end of the same is located below the top surface of the drain layer 12.

Figure 14:
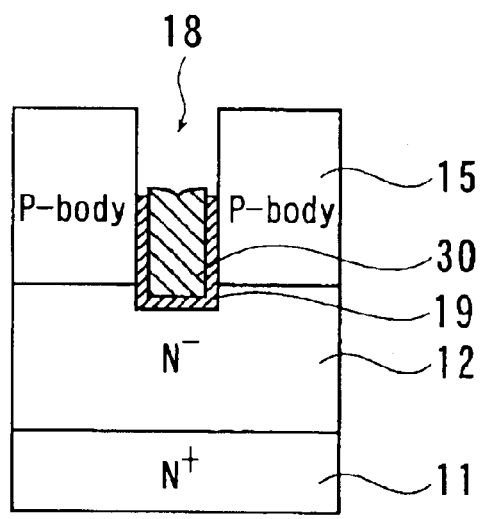
FIG. 14 is a sectional view illustrating a step following the step in FIG. 13.

In this state, the gate insulating film 19 is exposed on the top surface of the semiconductor substrate and at an upper part of the trench 18 and when the gate insulating film 19 is etched, the top surface of the semiconductor substrate and the inner circumferential surface of the upper part of the trench 18 are exposed (FIG. 14).

Figure 15:
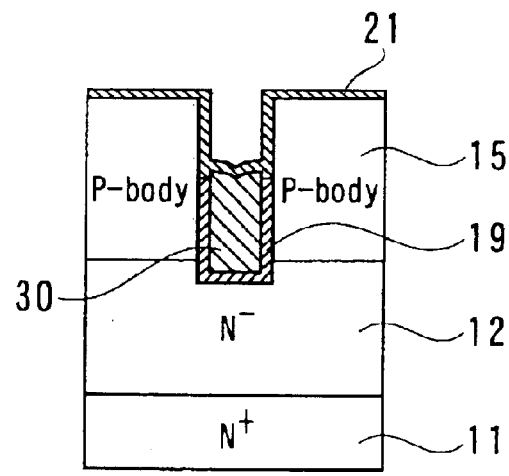
FIG. 15 is a sectional view illustrating a step following the step in FIG. 14.

Next, a thermal oxidation process is performed to oxidize the part of the semiconductor substrate where silicon is exposed and the polysilicon gate 30 exposed in the trench 18 to form a cap oxide film 21 on the entire surface of such regions (FIG. 15).

Figure 16:
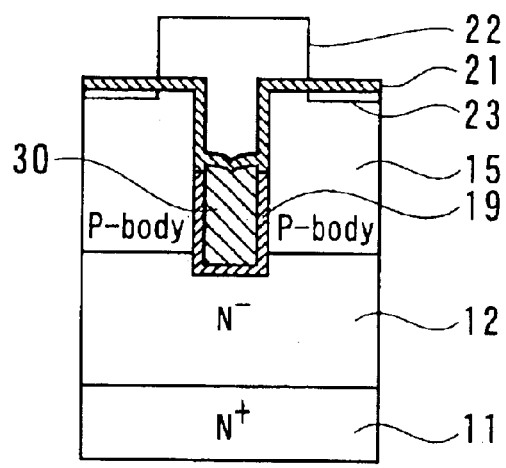
FIG. 16 is a sectional view illustrating a step following the step in FIG. 15.

Next, a patterned resist film 22 is formed on the top surface of the semiconductor substrate, and boron ions are implanted with the upper part of the trench 18 covered with the resist film 22, which forms p⁺-type implantation layers 23 on the top surfaces of the p-type body regions 15 (FIG. 16).

Figure 17:
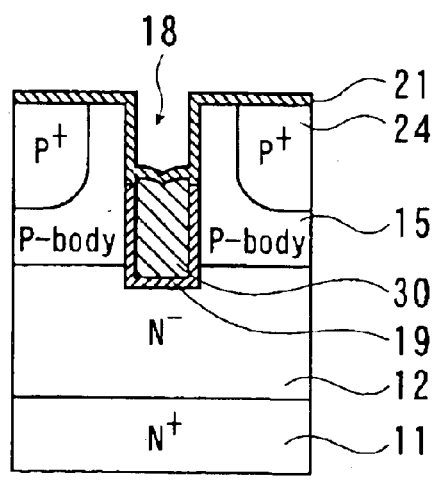
FIG. 17 is a sectional view illustrating a step following the step in FIG. 16.

Next, the resist film 22 is removed, and a thermal process is performed to diffuse the p⁺-type implantation layers 23 in the p-type body regions 15, thereby forming p⁺-type diffusion regions 24 to a depth of about 1 μm from the top surfaces of the p-type body regions 15 (FIG. 17).

Figure 18:
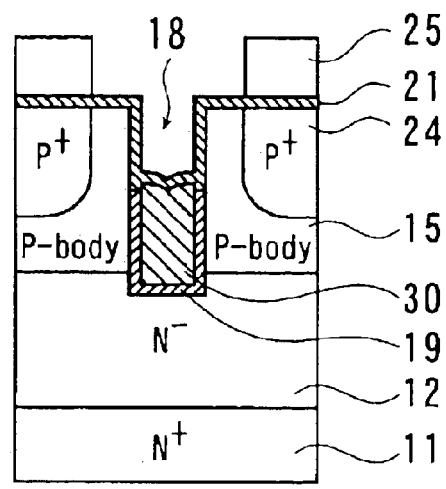
FIG. 18 is a sectional view illustrating a step following the step in FIG. 17.
Figure 19:
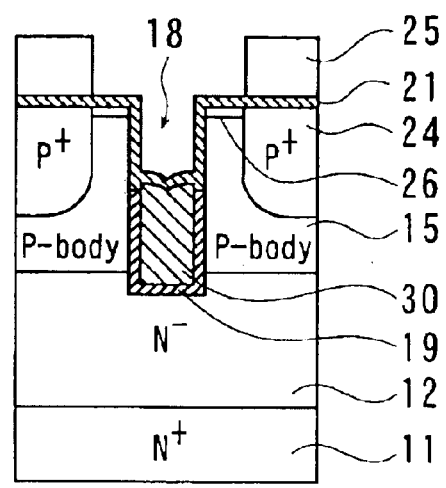
FIG. 19 is a sectional view illustrating a step following the step in FIG. 18.

Next, a resist film 25 having an opening in a region corresponding to the trench 18 and the neighborhood thereof is formed on the cap oxide film 21 (FIG. 18). Phosphorous ions (P⁺) are implanted through the opening of the resist film 25 using the resist film 25 as a mask, and the phosphorous ions (P⁺) are then implanted in the p-type body regions 15 to form n⁺-type implantation layers 26 in the vicinity of the top surfaces of the p-type body regions 15 (FIG. 19).

Thereafter, a thermal process is performed to diffuse the n⁺-type implantation layers 26 to form source regions 27 constituted by n⁺-type impurity diffusion layers that extend from the top surfaces of the p-type body regions 15 around the trench 18 in the direction of the depth thereof. The lower ends of the source regions 27 in the parts thereof in contact with the inner circumferential surface of the trench 18 are located below the upper end of the gate insulating film 19 and the upper end of the polysilicon gate 30.

That is, the upper ends of the gate insulating film 19 and polysilicon gate 30 are located above the lower ends of the source regions 27 on the side thereof closer to the inner circumferential surface of the trench 18 and, as described above, the lower ends of them are located below the upper end of the drain layer 12.

Figure 20:
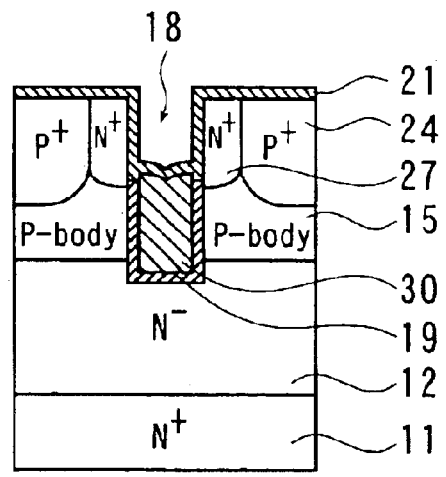
FIG. 20 is a sectional view illustrating a step following the step in FIG. 19.

Therefore, the gate insulating film 19 and polysilicon gate 30 are provided such that they reach to the drain layer 12, p-type body regions 15 and source regions 27 on the inner circumferential surface of the trench 18 as shown in FIG. 20.

Figure 21:
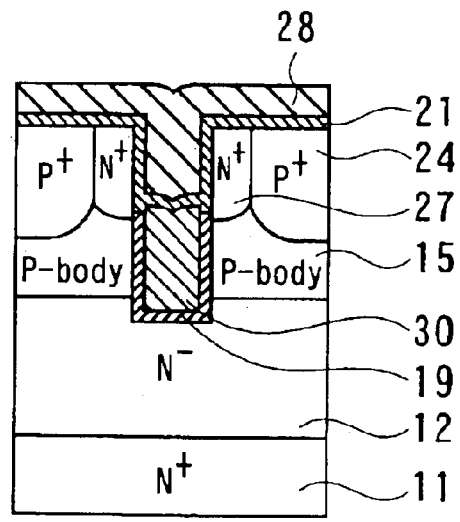
FIG. 21 is a sectional view illustrating a step following the step in FIG. 20.

Next, the CVD method is performed to form an insulating film 28 constituted by a PSG film on the cap oxide film 21 such that it extends on the top surface of the substrate and in the interior of the trench 18 (FIG. 21).

Figure 22:
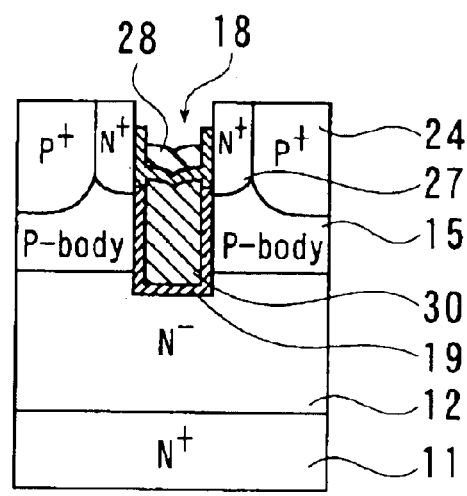
FIG. 22 is a sectional view illustrating a step following the step in FIG. 21.
Figure 23:
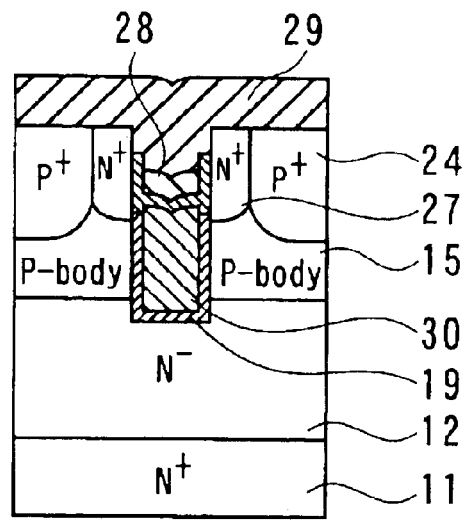
FIG. 23 is a sectional view illustrating a step following the step in FIG. 22.

Next, the insulating film 28 and cap oxide film 21 are etched for a predetermined period of time to remove the insulating film 28 and cap oxide film 21 on the p-type body regions 15 and to remove the insulating film 28 and cap oxide film 21 formed in the vicinity of the opening of the trench 18, which exposes the top surface of the semiconductor substrate and the inner circumferential surface of the upper part of the trench 18 (FIG. 22).

Thereafter, an Al thin film is formed on the entire surface using evaporation to form a source electrode film 29 (FIG. 23). The cells 3 are formed through the above-described steps.

In the power MOSFET 1 of the present embodiment as described above, the source electrode film 29 and source region 27 in each cell 3 are in direct contact with each other on a top surface 51 of the semiconductor substrate 5 and on an inner circumferential surface 52 of the trench 18, and are electrically connected to each other.

Therefore, even when the source regions 27 are formed in a small area on the semiconductor substrate 5, the contact area between the source regions 27 and source electrode film 29 can be increased by increasing the area of the source regions 27 exposed on the inner circumferential surface 52 of the trench 18.

Since there is no need for increasing the area occupied by each source region 27 to maintain source contact with a sufficiently low resistance as in the related art, the area occupied by the source regions 27 can be smaller than that in the related art, and this makes it possible to reduce the size of devices.

While the width Δw of the source regions 27 on the top surface of the semiconductor substrate 5 can be reduced only to about 1 μm in a structure according to the related art, the inventors of the present invention have confirmed that the structure of the present embodiment makes it possible to reduce the width Δw of the source regions 27 to 0.5 μm or less.

Thus, in the power MOSFET 1 of the present embodiment, the width Δw of the source region 27 of one cell can be reduced by 50% or more, and the area occupied by the same can therefore be also reduced significantly.

For example, when the width of a p$^+$-type diffusion region 24 was set at 1 μm and the width Δw of a source region according to the related art was set at 1.3 μm, the area occupied by the source region in the structure according to the related art was $(1+1.3\times2)^2-1^2=11.96$ (μm$^2$). On the contrary, when the width of a p$^+$-type diffusion region 24 according to the present invention is set at 1 μm as in the related art and the width Δw of a source region is set at 0.5 μm, the area occupied by the source region in the structure according to the invention is $(1+0.5\times2)^2-1^2=3$ (μm$^2$) In this case, the area can be reduced by 75% in terms of the area ratio. Therefore, a significant reduction of the area for the formation of this region can be achieved in a power MOSFET as a whole.

It is therefore possible to obtain cells 3 in which contact between a source electrode film 29 and source regions 27 is provided on an inner circumferential surface 52 of a trench 18 as described above, and such cells can be also manufactured through steps as described below.

Figure 25:
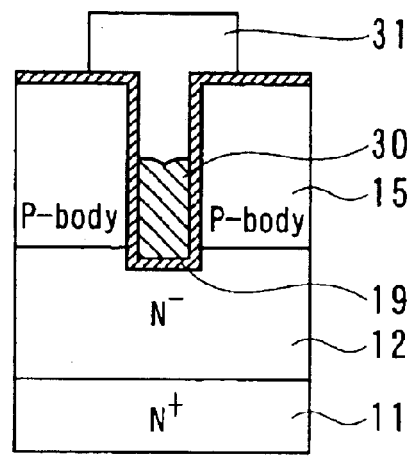
FIG. 25 is a sectional view illustrating another step of forming a cell according to the invention.
Figure 26:
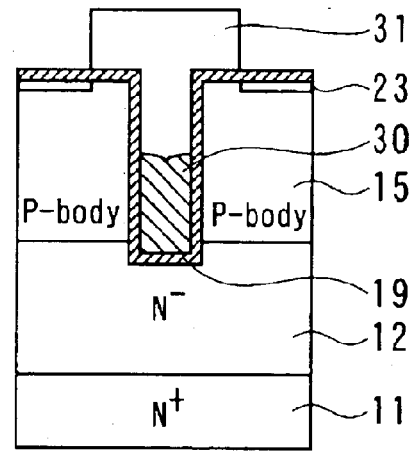
FIG. 26 is a sectional view illustrating a step following the step in FIG. 25.

First, a polysilicon gate 30 is formed in a trench 18 at the steps described with reference to FIGS. 3 through 13. The step in FIG. 13 is followed by photolithography to form a resist film 31 which covers the trench 18 from above and covers the neighborhood of the trench 18 (FIG. 25), and boron ions (B$^+$) are implanted into p-type body regions 15 using the same as a mask to form p$^+$-type implantation layers 23 on top surfaces of the p-type body regions 15 (FIG. 26).

Figure 27:
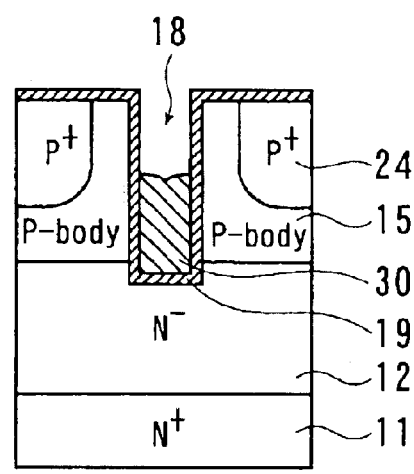
FIG. 27 is a sectional view illustrating a step following the step in FIG. 26.

Next, the resist film 31 is removed, and a thermal process is performed to thermally diffuse the p$^+$-type implantation layers 23 in the p-type body regions 15, thereby forming p$^+$-type diffusion regions 24 to a depth short of a drain region 12 from the top surfaces of the p-type body regions 15 (FIG. 27).

Figure 28:
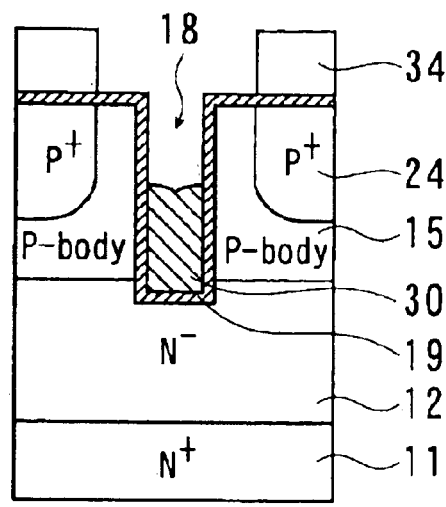
FIG. 28 is a sectional view illustrating a step following the step in FIG. 27.
Figure 29:
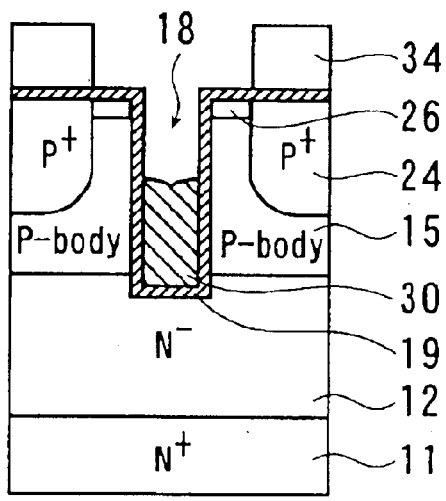
FIG. 29 is a sectional view illustrating a step following the step in FIG. 28.

Next, a patterned resist film 34 is formed on a gate insulating film 19 (FIG. 28). Phosphorous ions (P$^+$) are implanted in the p-type body regions 15 with regions excluding the trench 18 and the neighborhood thereof covered by the resist film 34 through the gate insulating film 19 to form n$^+$-type implantation layers 26 in the vicinity of the top surfaces of the p-type body regions 15 (FIG. 29).

Figure 30:
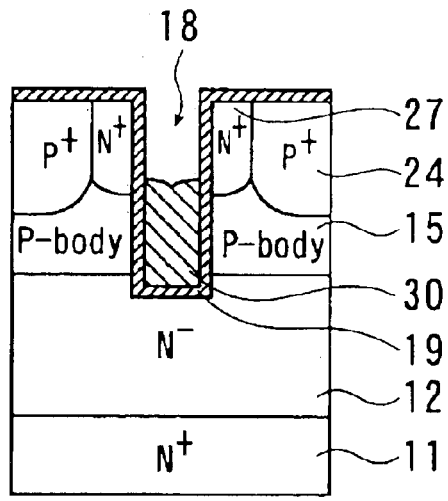
FIG. 30 is a sectional view illustrating a step following the step in FIG. 29.

Next, the resist film 34 is removed, and a thermal process is performed to diffuse the n$^+$-type implantation layers 26 in the p-type body regions 15 to form source regions 27 constituted by n$^+$-type impurity diffusion layers that extend from the top surfaces of the p-type body regions 15 around the trench 18 in the direction of the depth thereof. The lower ends of the source regions 27 in the parts thereof on the side of the inner circumferential surface of the trench 18 are located below the upper end of the polysilicon gate 30 (FIG. 30).

Figure 31:
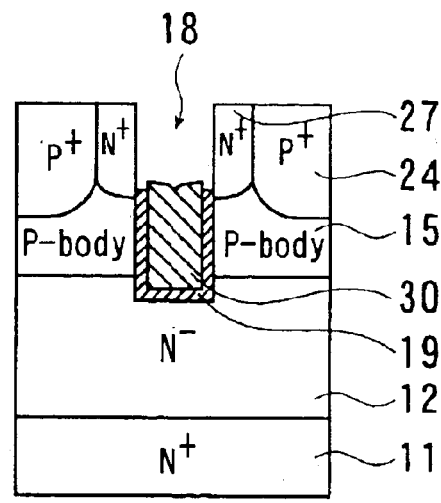
FIG. 31 is a sectional view illustrating a step following the step in FIG. 30.

In this state, the gate insulating film 19 is exposed on the top surface of the semiconductor substrate and at an upper part of the trench 18 and when the gate insulating film 19 is etched and removed, the top surface of the semiconductor substrate and the inner circumferential surface of the upper part of the trench 18 are exposed (FIG. 31).

Figure 32:
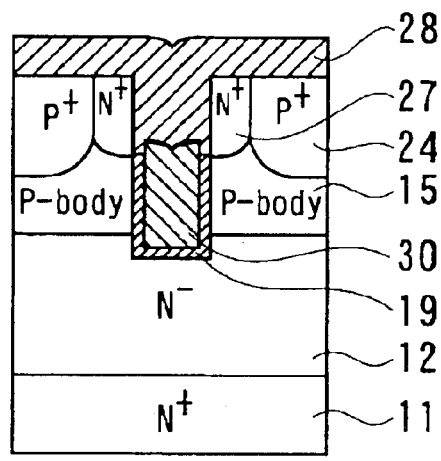
FIG. 32 is a sectional view illustrating a step following the step in FIG. 31.

Next, the CVD method is performed to form an insulating film 28 constituted by a PSG film on the top surface of the polysilicon gate 30 exposed in the trench 18, the inner circumferential surface of the trench 18 and the top surfaces of the p-type body regions 15, thereby filling the trench 18 with the insulating film 28 (FIG. 32).

Figure 33:
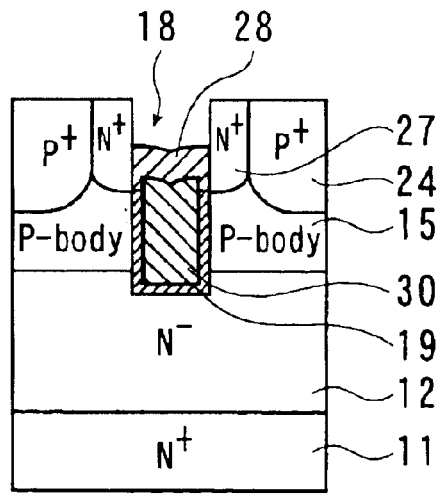
FIG. 33 is a sectional view illustrating a step following the step in FIG. 32.

Next, the insulating film 28 is etched for a predetermined period of time to remove the insulating film 28 on the top surface of the semiconductor substrate and to also etch the top surface of the insulating film 28 left in the trench 18 (FIG. 33).

Figure 34:
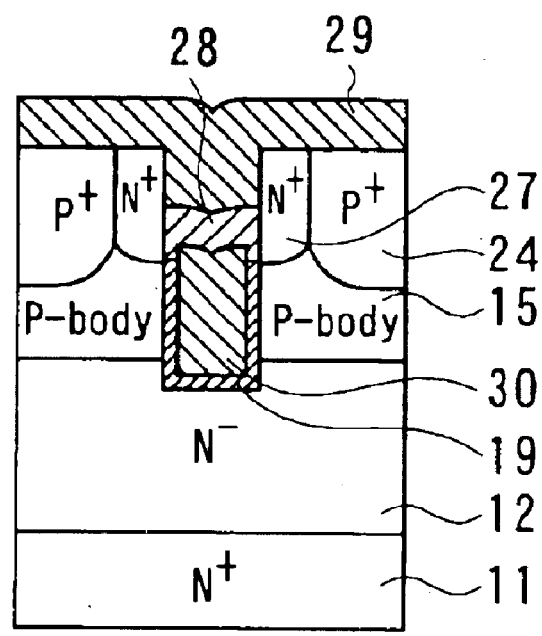
FIG. 34 is a sectional view illustrating a step following the step in FIG. 33.

Thereafter, an Al thin film is formed on the entire surface using evaporation to form a source electrode film 29 (FIG. 34).

In a cell formed in such a manner, the source electrode film 29 is in direct contact with the top surface of the source region 27 and a lateral surface thereof exposed on the inner circumferential surface of the trench 18, and electrical connection with the source electrode film 29 is established in those parts in contact therewith. Therefore, since a predetermined conduction resistance can be maintained even when the source region 27 occupies a small area on the top surface of the semiconductor substrate 5, the area occupied by the source region 27 can be smaller than that in the related art to allow a smaller device size.

Further, such cells in which contact between a source electrode film 29 and source regions 27 is established on an inner circumferential surface 52 of a trench 18 may be used in an IGBT (insulated gate bipolar mode transistor).

Figure 35:
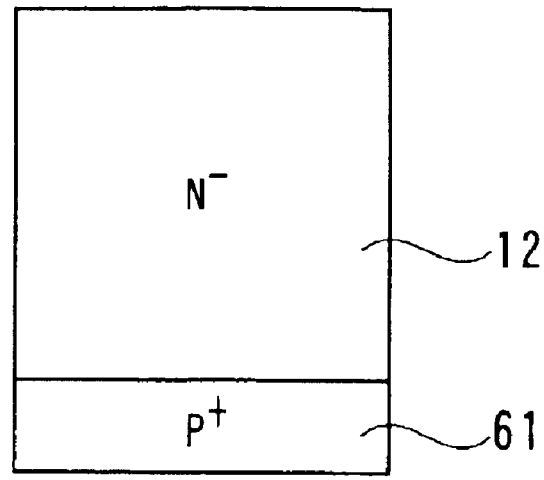
FIG. 35 is a sectional view illustrating a substrate used to manufacture an IGBT according to the embodiment of the invention.

An IGBT having such a cell structure can be obtained by first providing a p$^+$-type silicon substrate 61 and by forming an n$^-$-type epitaxial layer 12 having a thickness in the range from 50 to 60 μm and resistivity of 25 Ω·cm on a top surface of the p$^+$-type silicon substrate 61 (FIG. 35).

Figure 36:
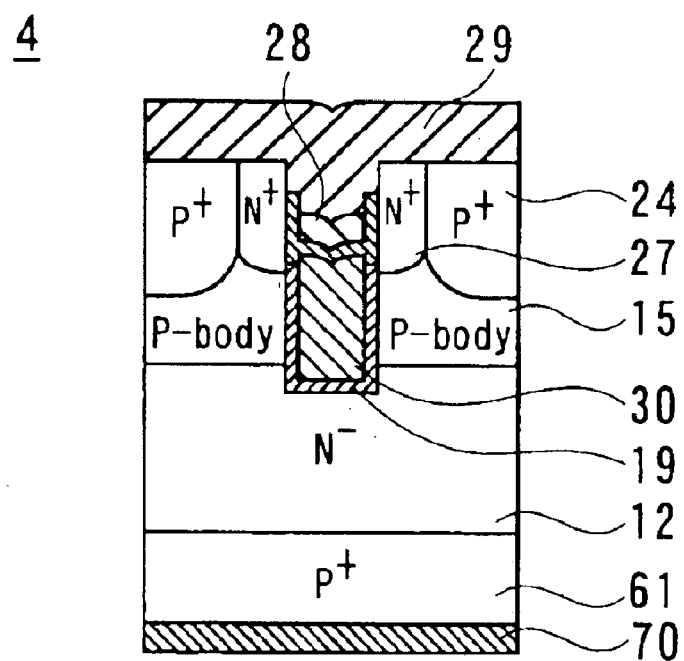
FIG. 36 is a sectional view illustrating a structure of a cell of the IGBT according to the embodiment of the invention.

Thereafter, after performing the steps in FIGS. 4 through 23, a metal film 70 is formed on a bottom surface of the p$^+$-type silicon substrate 61 to establish ohmic contact with the p$^+$-type silicon substrate 61, thereby forming an IGBT 4 having the structure shown in FIG. 36. In the IGBT 4, a source region 27, p$^+$-type silicon substrate 61 and polysilicon gate 30 serve as the emitter, collector and gate, respectively.

Such a cell structure may be used in a Schottky barrier type IGBT.

Figure 37:
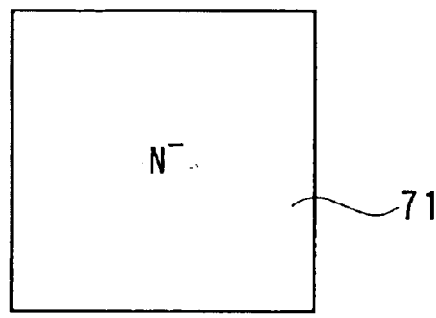
FIG. 37 is a sectional view illustrating a substrate used to manufacture another IGBT according to the embodiment of the invention.
Figure 38:
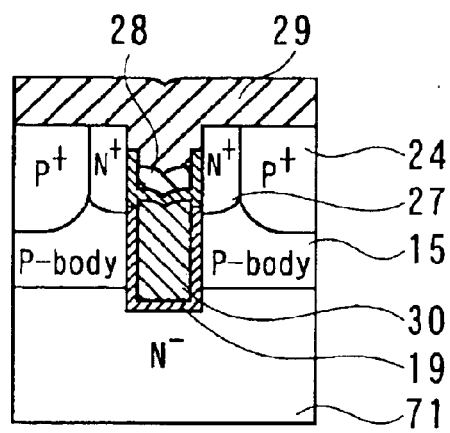
FIG. 38 is a sectional view illustrating a step for manufacturing the IGBT of FIG. 27 according to the embodiment of the invention.

A Schottky barrier type IGBT can be obtained by first providing an n$^-$-type silicon substrate 71 (FIG. 37) and by processing a top surface of the n$^-$-type silicon substrate 71 at the steps in FIGS. 4 through 23 to obtain the structure shown in FIG. 38. Thereafter, the thickness of the n$^-$-type silicon substrate 71 may be reduced by grinding the bottom side thereof (FIG. 39), and a metal film 80 may be formed on a bottom surface of the substrate 71 to establish Schottky contact with the n$^-$-type silicon substrate 71, thereby providing a Schottky barrier type IGBT 5 having the structure shown in FIG. 40. In the Schottky barrier type IGBT 5, a source region 27, a metal film 80 and polysilicon gate 30 serve as the emitter, collector and gate, respectively.

Figure 41:
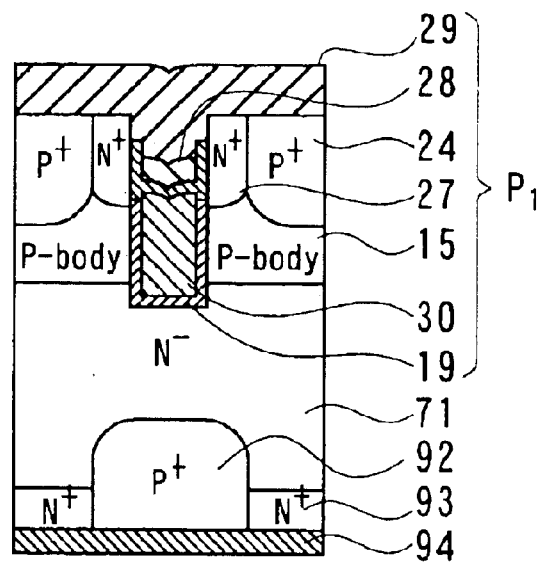
FIG. 41 is a sectional view illustrating a structure of a cell of the other IGBT according to the embodiment of the invention.

An IGBT 6 may be provided in which a p$^+$-type diffusion region 92 and an n$^+$-type diffusion region 93 are formed on a bottom surface of an n$^-$-type silicon substrate 71 as in the structure in FIG. 38 and in which a bottom surface electrode 94 constituted by a metal film is formed on the entire bottom surface of the n$^-$-type silicon substrate 71 (FIG. 41).

Figure 39:
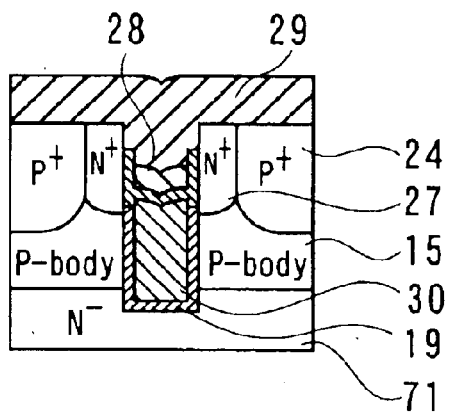
FIG. 39 is a sectional view illustrating a step following the step in FIG. 38.
Figure 40:
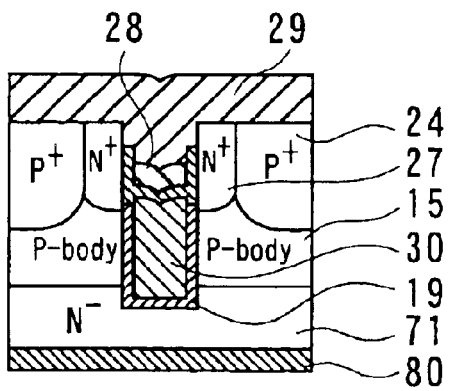
FIG. 40 is a sectional view illustrating a step following the step in FIG. 39.
Figure 42:
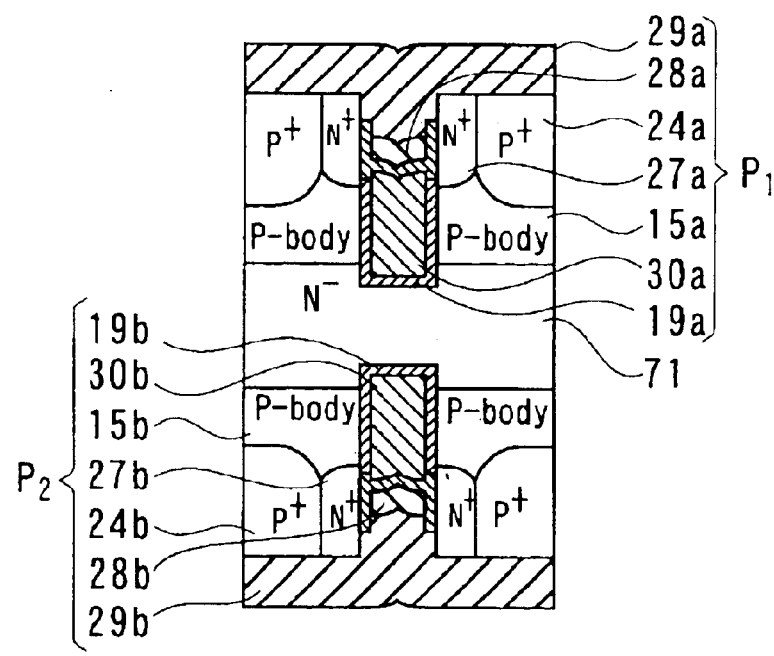
FIG. 42 is a sectional view illustrating a structure of a cell of a bidirectional conduction switch according to the embodiment of the invention.
Figure 43:
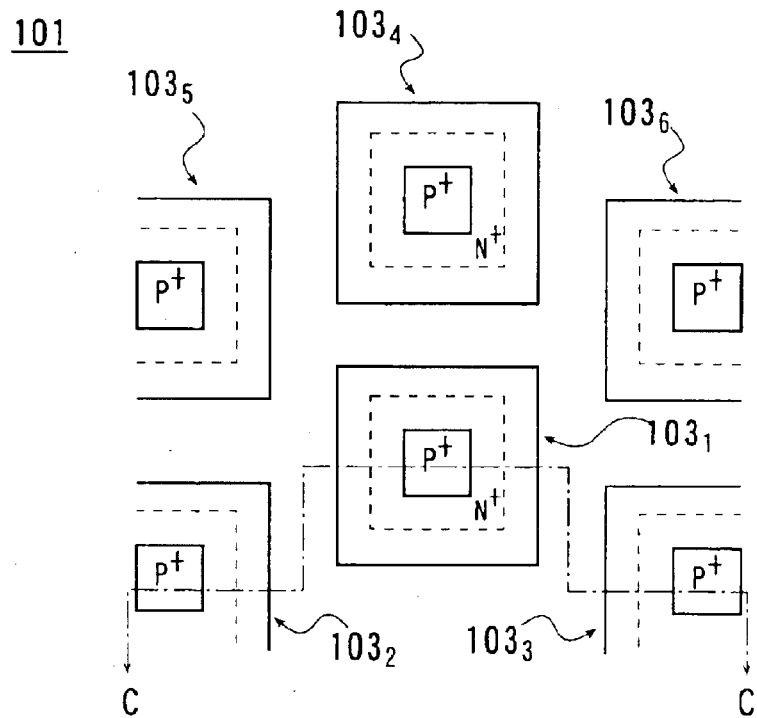
FIG. 43 is a plan view illustrating a configuration of cells of a power MOSFET according to the related art.
Figure 44:
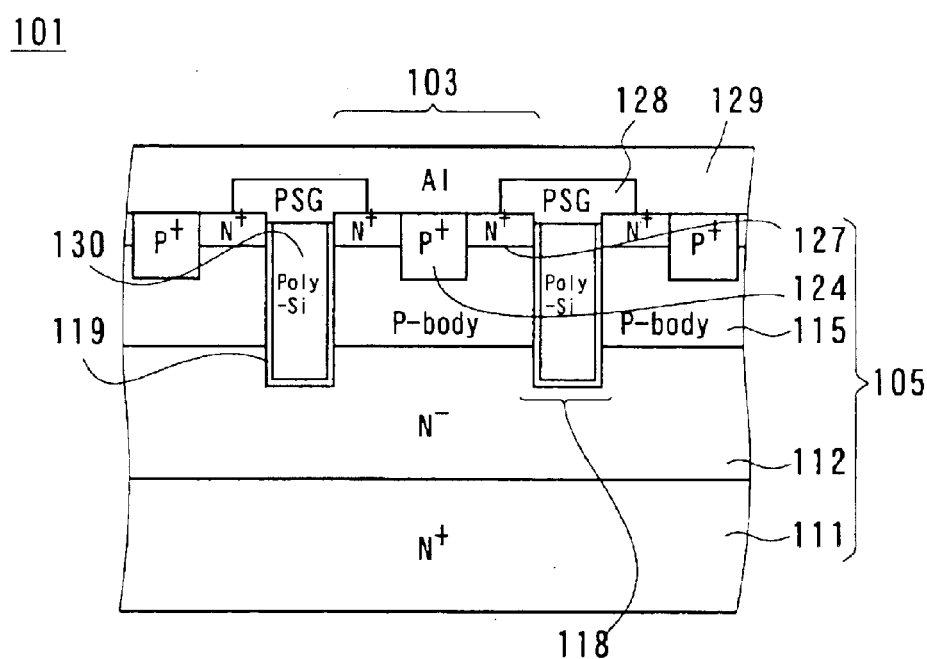
FIG. 44 is a sectional view illustrating the power MOSFET according to the related art.

Further, as shown in FIG. 42, a structure of a bidirectional conduction switch 7 may be provided in which a transistor P$_2$ having completely the same configuration as that of a transistor P$_1$ is formed on a bottom surface of an n$^-$-type silicon substrate 71 formed with the transistor P$_1$ having the structure shown in FIG. 39 on a top surface thereof. In FIG. 42, reference numbers 15$b$, 19$b$, 24$b$, 27$b$, 28$b$, 29$b$ and 30$b$ correspond to reference numbers 15$a$, 19$a$, 24$a$, 27$a$, 28$a$, 29$a$ and 30$b$ respectively and represent like parts.

While the above-described embodiment has referred to a power MOSFET 1, an IGBT 4, a Schottky barrier type IGBT 5 and a bidirectional conduction switch 7, transistors according to the present invention include all of such devices.

Figure 24:
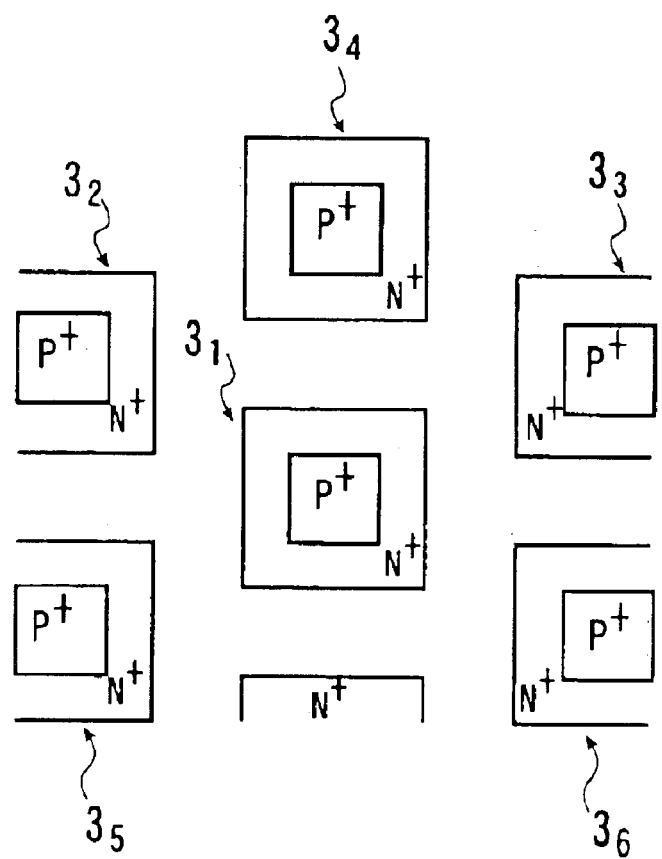
FIG. 24 is a plan view illustrating another configuration of cells according to the embodiment of the invention.

The configuration of the cells 3$_1$ through 3$_6$ in the above-described embodiment is not limited to grid-like configurations as shown in FIG. 1 and, for example, a staggered configuration as shown in FIG. 24 may be employed.

In the present embodiment, as described above, the n-type corresponds to the first conductivity type, and the p-type corresponds to the second conductivity type. This is not limiting the present invention, and the p-type and n-type may correspond to the first and second conductivity types, respectively.

While a PSG film is used as an insulating film 28, the present invention is not limited to such an insulating film and, for example, a silicon nitride film may be used instead.

While an Al film is used as a source electrode film 29, the present invention is not limited thereto and, for example, a copper film may be used instead.

While a drain layer 12 is formed as a result of epitaxial growth, a drain layer 12 according to the present invention is not limited to such a method of formation and may be formed using surface diffusion.

While cells 3$_1$ through 3$_6$ have a rectangular configuration as shown in FIG. 1, the present invention is not limited to such a cell configuration and, for example, circular cells may be employed.

In the above-described step for forming cells, source regions 27 are formed on top surfaces of p-type body regions 15 after a trench 18 is formed. However, this is not limiting the present invention, and the trench 18 may be formed after the source regions 27 are formed in advance on the top surfaces of the p-type body regions 15.

While all of the semiconductor substrates used in the above-described embodiment are silicon substrates, the present invention is not limited to such semiconductor substrates and may be applied to, for example, a substrate made of SiC or the like.

While a polysilicon gate is used as a gate electrode, the present invention is not limited to such a gate electrode and may be applied to a metal gate.

While the above-described embodiment has referred to transistors having a cell structure, the invention is not limited thereto and may be applied to transistors having a stripe configuration.

While a silicon oxide film is used as a gate insulating film 19, a gate insulating film 19 according to the present invention is not limited thereto and, for example, a silicon nitride film or a composite film consisting of a silicon oxide film and a silicon nitride film may be used.

The present invention makes it possible to reduce the area occupied by source regions on the top surface of a semiconductor substrate, thereby allowing a reduction of the size of devices.

What is claimed is:

1. A method of manufacturing a transistor, comprising the steps of:
    diffusing an impurity on a top surface of a drain layer of a first conductivity type provided on a semiconductor layer to form a conductive region of a second conductivity type;
    forming a trench having a bottom surface which is located deeper than a bottom surface of said conductive region;
    forming a gate insulating film at least on a side surface of said trench;
    forming a gate electrode material in said trench;
    forming a source region of the first conductivity type which is in contact with said gate insulating film and whose lower end is lower than the upper end of said gate electrode material, in an entire cross-section thereof, in said conductive region;
    forming a film which consists of an insulating material having an upper end which is lower than the opening of said trench on said gate electrode material; and
    exposing said source region on an upper part of the side, surface of said trench and forming a source electrode film in contact with said source region.

2. A method of manufacturing a transistor according to claim 1, wherein said step of forming a film which consists of said insulating material includes the steps of:
    forming a first insulating film on a top surface of said gate electrode material, a side surface of said trench in the vicinity of the opening thereof and a top surface of said conductive region;
    forming a second insulating film on a top surface of said first insulating film to fill the interior of said trench; and
    removing an upper part of said second insulating film inside of said trench together with said first and second insulating films outside of said trench to expose said source region on an upper part of the side surface of said trench.

3. A method of manufacturing a transistor according to claim 2,
    wherein said step of forming said gate electrode material includes the step of depositing polysilicon in said trench, and
    wherein said step of forming said first insulating film includes the step of oxidizing a top surface of said gate electrode film, a side surface of said trench in the vicinity of the opening thereof and a top surface of said conductive region to form said first insulating film.

* * * * *